US012652830B2

(12) United States Patent
Shimizu et al.

(10) Patent No.: US 12,652,830 B2
(45) Date of Patent: Jun. 9, 2026

(54) SEMICONDUCTOR DEVICE AND POWER CONVERSION DEVICE

(71) Applicant: Hitachi Power Semiconductor Device, Ltd., Ibaraki (JP)

(72) Inventors: Haruka Shimizu, Tokyo (JP); Takeru Suto, Tokyo (JP); Yuki Mori, Tokyo (JP)

(73) Assignee: MINEBEA POWER SEMICONDUCTOR DEVICE INC., Ibaraki (JP)

( * ) Notice: Subject to any disclaimer, the term of this patent is extended or adjusted under 35 U.S.C. 154(b) by 381 days.

(21) Appl. No.: 18/570,670

(22) PCT Filed: Apr. 22, 2022

(86) PCT No.: PCT/JP2022/018524
§ 371 (c)(1),
(2) Date: Dec. 15, 2023

(87) PCT Pub. No.: WO2023/047687
PCT Pub. Date: Mar. 30, 2023

(65) Prior Publication Data
US 2024/0290829 A1    Aug. 29, 2024

(30) Foreign Application Priority Data

Sep. 22, 2021    (JP) ................................ 2021-154057

(51) Int. Cl.
H10D 62/10 (2025.01)
H10D 30/66 (2025.01)
H10D 62/17 (2025.01)

(52) U.S. Cl.
CPC ......... H10D 62/106 (2025.01); H10D 30/668 (2025.01); H10D 62/393 (2025.01)

(58) Field of Classification Search
CPC ...... F03D 17/006; F03D 9/007; F03D 17/026; G06F 30/20; F05B 2260/821;
(Continued)

(56) References Cited

U.S. PATENT DOCUMENTS

| | | |
|---|---|---|
| 5,541,430 A | 7/1996 | Terashima |
| 2004/0119117 A1 | 6/2004 | Kushida |

(Continued)

FOREIGN PATENT DOCUMENTS

| | | |
|---|---|---|
| JP | 05-347414 A | 12/1993 |
| JP | 2004-207289 A | 7/2004 |

(Continued)

OTHER PUBLICATIONS

International Search Report PCT/JP2022/018524 Jul. 19, 2022.

*Primary Examiner* — Shahan Ur Rahaman
(74) *Attorney, Agent, or Firm* — MATTINGLY & MALUR, PC

(57) ABSTRACT

A semiconductor device includes: a semiconductor substrate having a drift layer of a first conductivity type, a body region of a second conductivity type, and a JFET region of the first conductivity type in contact with the body region on both sides on the drift layer; a plurality of trenches formed in an upper surface of the semiconductor substrate and extending in a first direction; and a gate electrode formed in the trenches and on the upper surface of the semiconductor substrate with an insulating film interposed therebetween. In a unit cell, a first trench group composed of a plurality of trenches lined up in a second direction that is orthogonal to the first direction and a second trench group composed of a plurality of trenches lined up in the second direction are lined up in the first direction, and have a channel region that is shallower than the trenches.

9 Claims, 8 Drawing Sheets

(58) Field of Classification Search
   CPC .......... F05B 2260/8211; F05B 2270/32; F05B
               2270/321; F05B 2270/328; Y02E 10/72
   See application file for complete search history.

(56)                References Cited

U.S. PATENT DOCUMENTS

| | | | |
|---|---|---|---|
| 2006/0022298 | A1 | 2/2006 | Shiraishi et al. |
| 2018/0350977 | A1 | 12/2018 | Knoll et al. |
| 2019/0097042 | A1 | 3/2019 | Meiser et al. |
| 2019/0206987 | A1* | 7/2019 | Adachi ............... H10D 62/393 |
| 2020/0220008 | A1* | 7/2020 | Takeuchi ............ H10D 62/159 |
| 2020/0411642 | A1 | 12/2020 | Ueno |
| 2021/0005746 | A1* | 1/2021 | Suto ..................... H10D 62/107 |

FOREIGN PATENT DOCUMENTS

| | | | |
|---|---|---|---|
| JP | 2011-228719 | A | 11/2011 |
| JP | 2019-503591 | A | 2/2019 |
| JP | 2019-068065 | A | 4/2019 |
| JP | 2020-080387 | A | 5/2020 |
| JP | 2021-005610 | A | 1/2021 |
| JP | 2021-012934 | A | 2/2021 |

* cited by examiner

SEMICONDUCTOR DEVICE AND POWER CONVERSION DEVICE

TECHNICAL FIELD

The present invention relates to a semiconductor device having a field effect transistor in which a channel is formed on a side surface of a semiconductor layer.

BACKGROUND ART

In recent years, a metal oxide semiconductor field effect transistor (MOSFET) in which a trench is formed in a direction orthogonal to a source contact region formed in a stripe shape in a plan view, and a gate electrode is buried in the trench via an insulating film has been known. In this MOSFET, a current flows in a depth direction on a trench side surface. In this structure, it is possible to reduce an on-resistance by reducing a pitch of trenches and increasing the trench density.

For example, PTL 1 (JP 2004-207289 A) discloses a MOSFET including a buried gate in a trench formed on an upper surface of a semiconductor substrate and a channel formed on a side surface of the trench.

In addition, PTL 2 (JP 2021-12934 A) discloses a vertical MOSFET including a gate electrode crossing immediately over each of two trenches adjacent to each other in an extension direction of the trenches.

CITATION LIST

Patent Literatures

PTL 1: JP 2004-207289 A
PTL 2: JP 2021-12934 A

SUMMARY OF INVENTION

Technical Problem

The MOSFET disclosed in PTL 1 has a large gate capacitance because a large number of trenches are formed, and has a large gate wiring resistance because a gate wiring extends in a direction across the trenches. Therefore, there is a problem of a large gate delay determined by CR (capacitance×resistance). In addition, the length of a long side of the trench is determined by the design of a JFET region, and thus it is difficult to lengthen the trench and widen a gate wiring width.

In PTL 2, while two trenches are included in a unit cell in the extension direction of the trenches, there is only one JFET region provided in the unit cell. Thus, there is a problem of a large on-resistance.

Other problems and novel features will become apparent from the description of the present specification and the accompanying drawings.

Solution to Problem

An outline of representative embodiments disclosed in the present application will be briefly described as follows.

According to an embodiment, a semiconductor device includes a semiconductor substrate having a drift layer of a first conductivity type, a plurality of trenches formed on an upper surface of the semiconductor substrate and extending in a first direction along the upper surface of the semiconductor substrate, a body region of a second conductivity type different from the first conductivity type, the body region being formed on a side surface of the trench in a lateral direction, a source region of the first conductivity type, the source region being formed on the upper surface of the semiconductor substrate and formed in the body region, a JFET region of the first conductivity type, the JFET region being formed on an upper surface of the drift layer and having side surfaces on both sides in contact with the body region, a drain region of the first conductivity type, the drain region being formed on a lower surface of the semiconductor substrate and electrically connected to the drift layer, and a gate electrode formed in the trench and on the upper surface of the semiconductor substrate via an insulating film. In a unit cell, some of the plurality of trenches are arranged in a second direction intersecting with the first direction in a plan view to form a first trench group, and another some of the plurality of trenches are arranged in the second direction to form a second trench group. The trenches forming the first trench group and the trenches forming the second trench group are arranged side by side in the first direction. The source region is also formed between the trenches adjacent to each other in the second direction. A channel region formed at a depth shallower than a depth of the trench is provided on a lower surface of the source region formed between the trenches adjacent to each other in the second direction. The gate electrode includes a first portion buried in each of the plurality of trenches, and a second portion located on the upper surface of the semiconductor substrate, connecting first portions arranged in the first direction to each other, and connecting the first portions arranged in the second direction to each other. A plurality of JFET regions is provided per unit cell.

Advantageous Effects of Invention

Effects obtained by a representative one of the inventions disclosed in the present application will be briefly described as follows.

According to the present invention, it is possible to improve the performance of the semiconductor device.

BRIEF DESCRIPTION OF DRAWINGS

FIG. 2 is a cross-sectional view illustrating the semiconductor device in Embodiment 1.

FIG. 3 is a cross-sectional view illustrating the semiconductor device in Embodiment 1.

DESCRIPTION OF EMBODIMENTS

Figure 1:
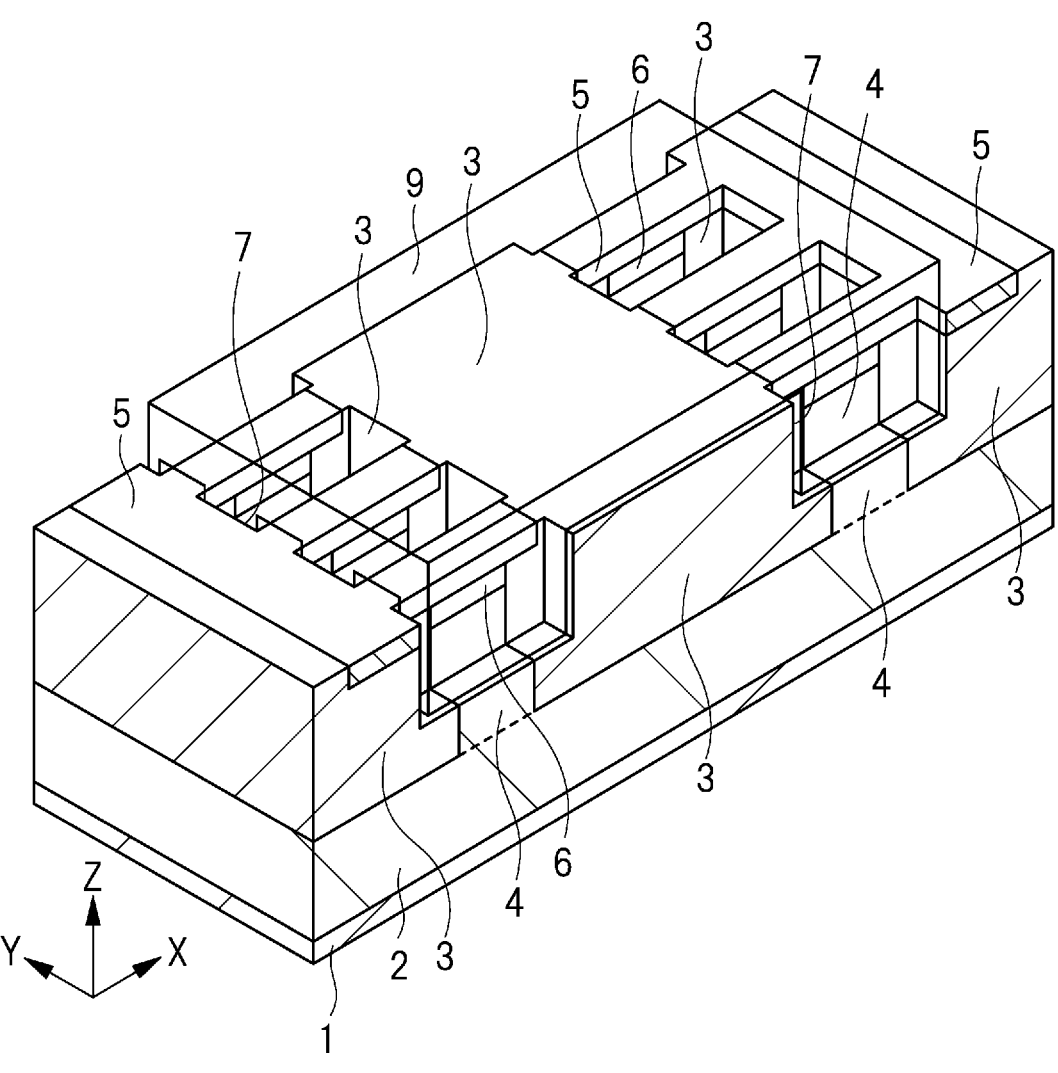
FIG. 1 is a bird-eye view illustrating a semiconductor device according to Embodiment 1.

Hereinafter, embodiments of the present invention will be described in detail with reference to the drawings. Note that, in the drawings for describing the embodiments, members having the same functions are denoted by the same reference signs, and repeated description thereof will be omitted. In the following embodiments, the description of the same or similar parts will not be repeated in principle unless otherwise necessary. In addition, in the drawings for describing the embodiments, hatching may be applied even in a plan view, a perspective view, or the like for easy understanding of the configuration. Furthermore, in the drawings for describing the embodiments, hatching may be omitted in the cross-sectional view for easy understanding of the configuration.

In addition, "−" and "+" are signs indicating relative impurity concentrations of conductivity types of an n-type and a p-type. For example, the impurity concentration of the n-type impurity increases in the order of "n-", "n", and "n+". <Details of Room for Improvement>

Figure 12:
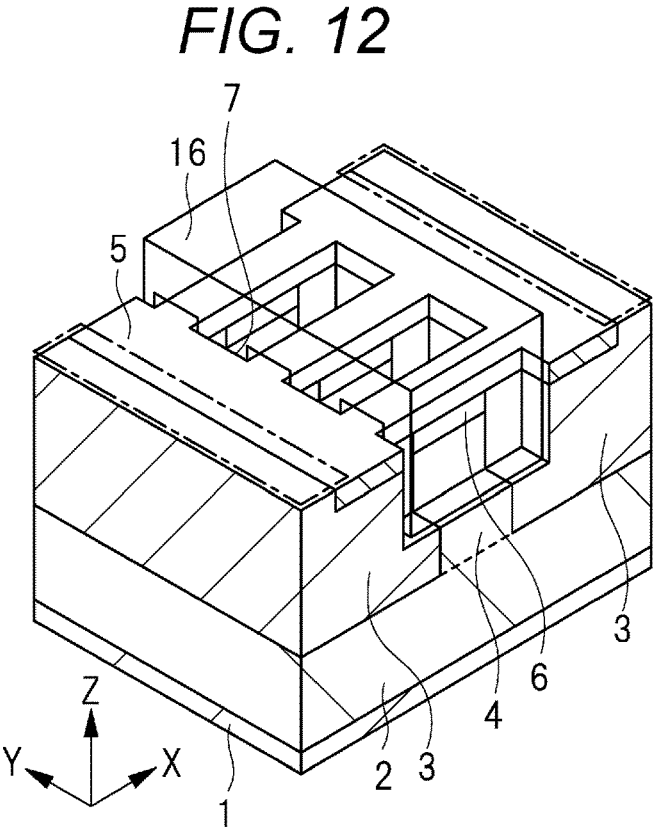
FIG. 12 is a bird-eye view illustrating a semiconductor device according to Comparative Example 1.

Hereinafter, details of room for improvement will be described with reference to FIG. 12. FIG. 12 is a bird-eye view illustrating a semiconductor device in Comparative Example 1. In FIG. 12, illustrations of a gate insulating film, an interlayer insulating film, a silicide layer, a source electrode, and the like in a structure on an epitaxial layer are omitted. In FIG. 12, a drain electrode below a SiC substrate is not illustrated.

FIG. 12 illustrates a trench-type SiC power metal oxide semiconductor field effect transistor (MOSFET) in Comparative Example 1. This element may be simply referred to as a MOSFET below.

As illustrated in FIG. 12, in Comparative Example 1, an n-type epitaxial layer (semiconductor layer) made of SiC having an impurity concentration lower than that of an n+ type SiC substrate is formed on an upper surface of an n+ type SiC substrate made of SiC (silicon carbide). The SiC substrate functions as a drain region 1, and the epitaxial layer functions as a drift layer 2. The SiC substrate and the epitaxial layer form a SiC epitaxial substrate. The thickness of the epitaxial layer is, for example, about 5 to 50 μm.

A p-type body region (well region) 3 is formed in the epitaxial layer with a predetermined depth from the upper surface of the epitaxial layer (the upper surface of the SiC epitaxial substrate). The body region 3 is electrically connected to a source electrode (not illustrated) via an n+ type source region 5 formed from an upper surface of the body region 3 to a middle depth of the body region 3. The source region 5 is connected to the source electrode in a source contact region indicated by a one-dot chain line in FIG. 12. A plurality of source contact regions extend in a Y-direction and are arranged in an X-direction. That is, the source contact region is formed in a stripe shape. The X-direction and the Y-direction are directions along the upper surface (main surface) of the SiC epitaxial substrate and are perpendicular to each other.

A JFET region 4 is formed in the epitaxial layer. The body region 3, the JFET region 4, and the source region 5 all extend in the Y-direction. A plurality of trenches 7 are formed on the upper surface of the epitaxial layer immediately above the JFET region 4 to be arranged in the Y-direction. Each of the trenches 7 extends in the X-direction and is formed up to the middle depth of the body region 3. The source region 5 is formed up to a middle depth of the trench from an upper surface of a plate-like epitaxial layer (fin) between the trenches 7 adjacent to each other in the Y-direction. Body regions 3 arranged in the X-direction, a p-type channel region 6 between the body regions 3, and the JFET region 4 below the channel region 6 are formed below the source region 5 in the plate-like epitaxial layer.

A gate electrode 16 is buried in the trench 7 via a gate insulating film (not illustrated). The MOSFET includes at least the channel region 6 including a channel formation region, the source region 5, the drain region 1 (SiC substrate), and the gate electrode 16 in the trench 7. A plurality of gate electrodes 16 (trench gate electrodes) in the trenches 7 are arranged in the Y-direction, and the gate electrode 16 at a portion connecting the gate electrodes 16 to each other above the trench 7 functions as a gate wiring.

When the gate electrode 16 is in an ON state, the electrons flowing through the MOSFET pass from the n+ type source region 5 through a channel formed in the p-type channel region 6 on the side surface of the trench 7 adjacent to the gate electrode. Then, the electrons flowing in a Z-direction sequentially move to the n-type JFET region 4, the n-type drift layer 2, the drain region 1, and a drain electrode (not illustrated) at the bottom of the SiC substrate. In this manner, a current flows between the source and the drain. The Z-direction is a thickness direction of the SiC epitaxial substrate. The X-direction, the Y-direction, and the Z-direction are perpendicular to each other.

In the MOSFET in which the channel is formed on the side surface of the SiC epitaxial substrate as in the MOSFET in Comparative Example 1, a large number of trenches 7 are formed, and thus the gate capacitance (gate-source capacitance) is large. In addition, since the gate wiring extends to cross over the plurality of trenches 7, the gate wiring resistance is large. Therefore, in the MOSFET having the trench 7, there is a problem that a gate delay time determined by CR (capacitance×resistance) is larger than a gate delay time of a planar type MOSFET having no trench. On the other hand, it is conceivable that the gate wiring resistance can be reduced by lengthening the side (long side) in an extension direction (X-direction) of the trench 7 and widening a gate wiring width. However, since the long side of the trench 7 is determined by the design of the JFET region 4, it is difficult to lengthen the trench 7 and widen the gate wiring width.

As described above, in a semiconductor device including the MOSFET in which the channel is formed on the side surface of the SiC epitaxial substrate, there is a first room for improvement that the gate delay time is large because the gate wiring resistance is large.

Figure 13:
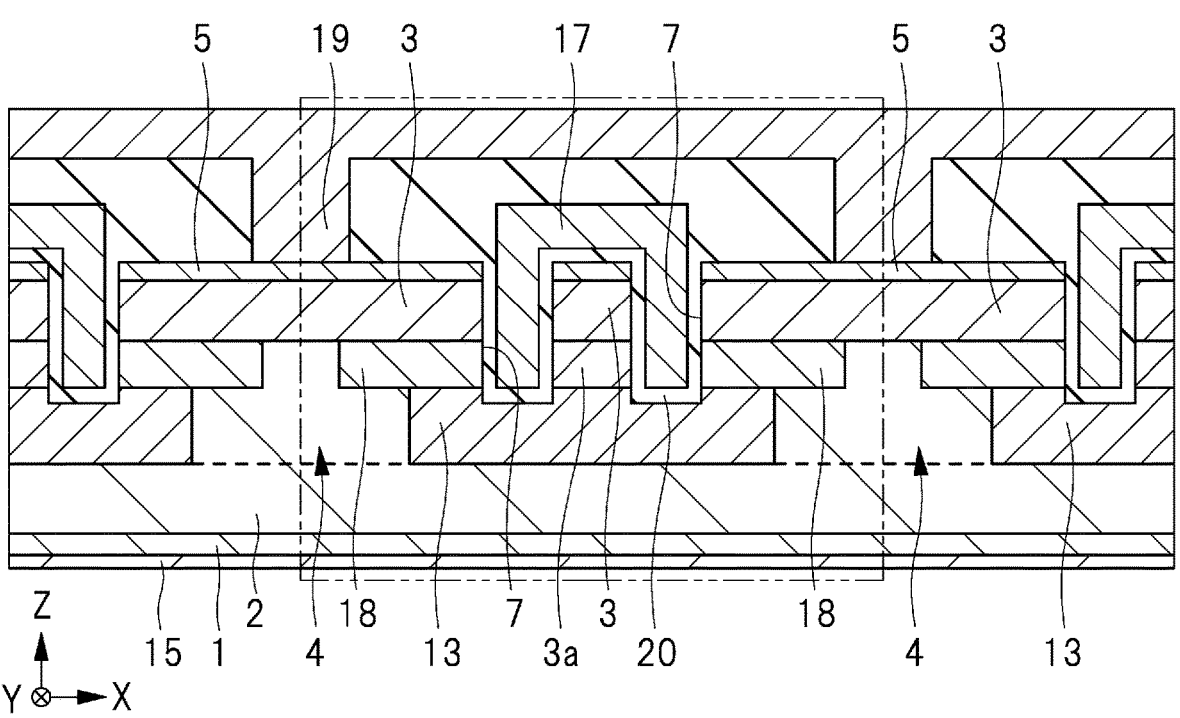
FIG. 13 is a cross-sectional view illustrating a semiconductor device according to Comparative Example 2.

On the other hand, as illustrated in FIG. 13, it is conceivable to form a gate electrode 17 extending between parts immediately above two trenches 7 arranged in the extension direction of the trench 7. FIG. 13 is a cross-sectional view illustrating a semiconductor device in Comparative Example 2.

The semiconductor device in Comparative Example 2 includes a SiC epitaxial substrate. The SiC epitaxial substrate includes an n+ type SiC substrate and an n-type epitaxial layer formed on the SiC substrate. The epitaxial layer is mainly formed by a drift layer 2, and the SiC substrate forms a drain region 1. The drift layer 2, body regions 3 and 3a, a source region 5, a current diffusion region 18, a guard region 13, the drain region 1, and a JFET region 4 are formed in the epitaxial layer.

A lower surface of the drain region 1 is covered with a drain electrode 15. A source region 5 is formed on the upper surface of the epitaxial layer. The body region 3 which is a p-type semiconductor region is formed between the source region 5 and the drift layer 2 in contact with the lower surface of the source region 5.

The current diffusion region 18 which is an n$^+$ type semiconductor region is formed in contact with the lower surface of the body region 3 below the body region 3. In addition, the JFET region 4 is formed in a region that is adjacent to the current diffusion region 18 in the X-direction and is immediately below a region in contact with a source electrode 19 extending in the Y-direction. Here, in the epitaxial layer below the body region 3, the JFET region 4 is formed from the lower surface of the body region 3 to the upper surface of the drift layer 2. In addition, the p-type body region 3a is formed in a region that is adjacent to the current diffusion region 18 in the X-direction with the trench 7 interposed therebetween, and is opposite to the JFET region 4. An upper surface of the body region 3a is in contact with the body region 3. The p-type impurity concentrations of the body regions 3 and 3a are equal to each other. The current diffusion region 18 is a low-resistance region for spreading the current flowing in the drift layer 2 through the JFET region 4 in the X-direction and flowing the current in a wide region.

A guard region 13 which is a p+ type semiconductor region is formed in contact with a lower surface of each of the current diffusion region 18 and the body region 3a below each of the current diffusion region 18 and the body region 3a. In addition, a trench 7 is formed from the upper surface of the epitaxial layer, that is, from the upper surface of the source region 5 to the middle depth of the guard region 13. The trench 7 penetrates the body region 3 and does not reach the lower surface (lower end) of the guard region 13. The trench 7 is surrounded by the guard region 13 in a plan view.

Among four side surfaces of the trench 7 having a rectangular planar shape, three side surfaces are in contact with the current diffusion region 18. Among the four side surfaces of the trench 7, one side surface excluding the three side surfaces is in contact with the body region 3a at the same height as the current diffusion region 18. The JFET region 4 is formed in a region that is adjacent to the guard region 13 in the X-direction and is immediately below a portion at which the source electrode 19 is connected to the source region 5. The body regions 3 and 3a are electrically connected to the guard region 13.

A plurality of trenches 7 are formed to be arranged in the Y-direction, and a gate electrode 17 is buried in each of the trenches 7 via an insulating film 20. The gate electrodes 17 in the respective trenches 7 are formed above the source region 5 via the insulating film 20, and are connected to each other by the gate electrodes 17 extending in the Y-direction. The lower surface, the side surface, and the upper surface of the gate electrode 17 extending in the Y-direction above the source region 5 are covered with the insulating film 20. That is, the insulating film 20 includes a gate insulating film formed below the gate electrode 17 extending in the Y-direction and an interlayer insulating film formed above the gate insulating film.

The source electrode 19 is formed in a connection hole penetrating the insulating film 20 on the semiconductor substrate and on the insulating film 20. The source electrode 19 with which the connection hole is filled and the source electrode 19 on the insulating film 20 are integrated with each other.

In the drift layer 2 below the current diffusion region 18, the junction field effect transistor (JFET) region 4 which is an n-type or n-type semiconductor region is formed to be arranged with the guard region 13 in the X-direction. The JFET region 4 is an n-type semiconductor region of which side surfaces on both sides are in contact with a p-type semiconductor region, and has a role of connecting the drift layer 2 and a channel region 6. Specifically, immediately below the current diffusion region 18, the JFET region 4 is adjacent to the guard region 13, and a portion of the JFET region 4 is adjacent to the current diffusion region 18 in the X-direction. The JFET region 4 extends in the Y-direction. In FIG. 13, the lower end of the JFET region 4 is indicated by a broken line.

The n-type impurity concentration of the JFET region 4 is equal to or higher than the n-type impurity concentration of the drift layer 2. In addition, the n-type impurity concentration of the JFET region 4 is lower than the n-type impurity concentration of each of the current diffusion region 18 and the source region 5. The JFET region 4 is a region between the guard regions 13 adjacent to each other in the X-direction. That is, the JFET region 4 is a region in which depletion layers that extend from the opposing side surfaces of the adjacent guard regions 13 when the MOSFET is in an OFF state come into contact with each other.

Next, an operation of the MOSFET in Comparative Example 2 will be described. The MOSFET includes at least the drain region 1, the source region 5, the body region 3, and the gate electrode 17. When the MOSFET is in the ON state, a channel is formed in the body region 3 and the body region 3a adjacent to the trench 7. That is, in the channel, a portion on the current diffusion region 18 is formed in the body region 3, and a portion adjacent to the current diffusion region 18 is formed in the body region 3a. That is, the channel is formed in the p-type semiconductor region adjacent to the trench 7. In Comparative Example 2, since all of the four side surfaces of the trench 7 are in contact with the body region 3, the channel is formed on all of the four side surfaces. At this time, a current sequentially flows from the drain electrode 15 to the source electrode 19 side through the drain region 1, the drift layer 2, the JFET region 4, the current diffusion region 18, the channel (body regions 3 and 3a), and the source region 5.

In FIG. 13, a region of a unit cell of the MOSFET is indicated by a two-dot chain line.

The unit cell of the MOSFET (may be simply referred to as a unit cell below) refers to one of structures repeatedly formed in a case where a plurality of the structures of the same MOSFET are arranged in the semiconductor device. The unit cell of the MOSFET in the present application refers to one of a plurality of structures repeatedly arranged without inversion, in a direction (X-direction) along the extension direction of the trench 7. That is, a portion surrounded by the two-dot chain line illustrated in FIG. 13 has a configuration in which two line-symmetric structures having the center in the X-direction as an axis are arranged, but, in the present application, a structure in which two structures are repeatedly arranged while being inverted is not referred to as a unit cell, and thus each of the two structures is not a unit cell. In addition, in a plan view, a unit cell may be formed between two source contact regions spaced apart from each other in the X-direction with the gate electrode interposed therebetween.

In Comparative Example 2, one unit cell includes two trenches 7 arranged in the X-direction, one gate electrode 17 crossing the trenches 7, one guard region 13, and one JFET region 4. Note that, in a region surrounded by a two-dot chain line illustrated in FIG. 13, it seems that two JFET regions 4 are formed on the left and right, but each of the JFET regions 4 forms one JFET region 4 together with the T region 4 at the end of the adjacent unit cell. Therefore, one JFET region 4 is formed per unit cell.

In Comparative Example 2, by forming the gate electrode 17 crossing the two trenches 7 in the extension direction (longitudinal direction) of the trench 7, the gate wiring resistance can be reduced. However, in Comparative Example 2, while two trenches 7 are arranged in the unit cell, only one JFET region 4 is formed. Therefore, there is second room for improvement that the JFET density is low and the on-resistance is high.

Therefore, in the embodiments of the present application, measures are made to solve the first and second room for improvement described above. Technical ideas in the embodiments to which the above measures are applied will be described.

Embodiment 1

A semiconductor device will be described below with reference to the drawings by using, as an example, a MOSFET (SiC power MOSFET) that forms an upper portion of an epitaxial layer and has a side surface of a trench as a channel region. Note that, here, an example in which silicon carbide (SiC) is used for a semiconductor substrate will be described, but the present embodiment is not limited thereto, and may be applied to other semiconductor substrates of silicon (Si) and the like.

<Structure of Semiconductor Device>

Figures 2, 3:
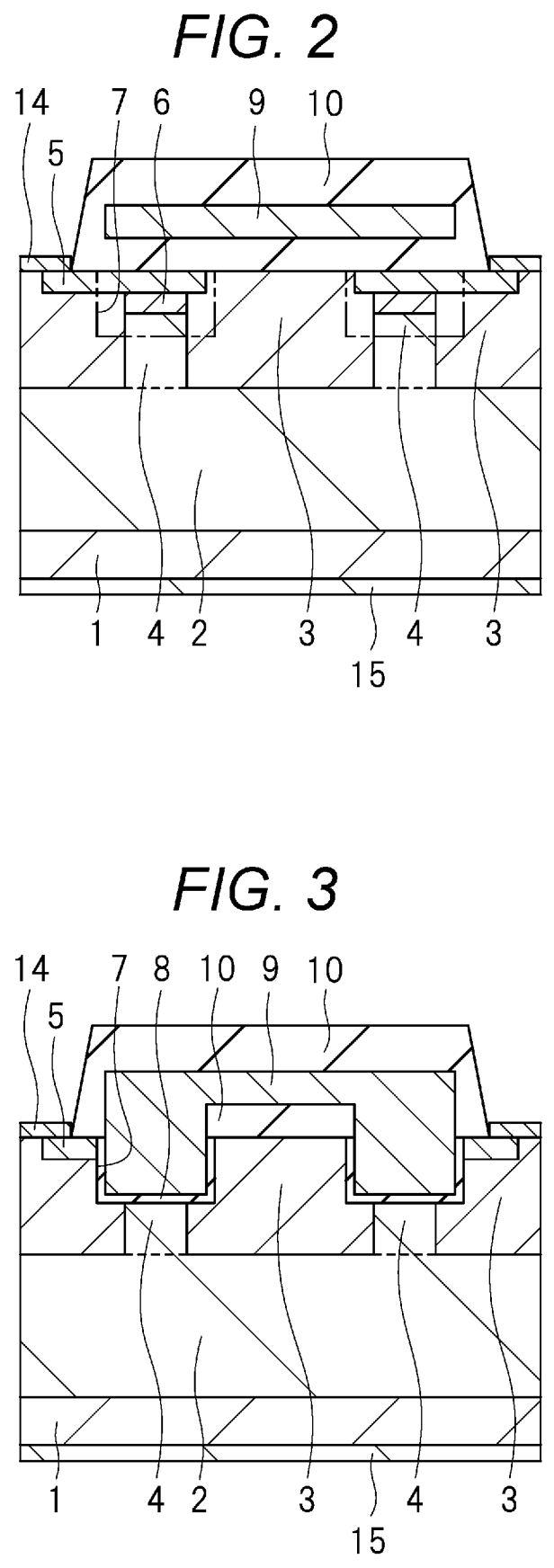
Figure 4:
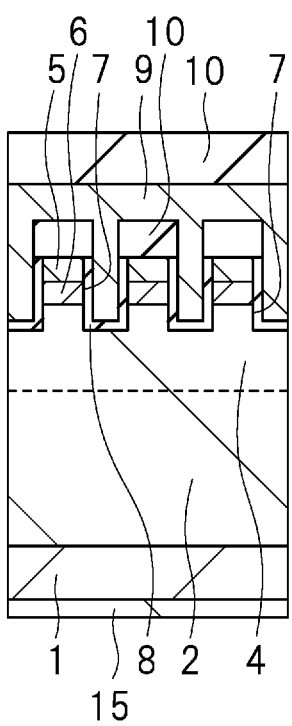
FIG. 4 is a cross-sectional view illustrating the semiconductor device in Embodiment 1.

A structure of a MOSFET which is a semiconductor device according to the present embodiment will be described with reference to FIGS. 1 to 4. FIG. 1 is a bird-eye view illustrating the semiconductor device in the present embodiment. FIG. 2 is a cross-sectional view along an extension direction (long-side direction, longitudinal direction) of a trench provided in the semiconductor device, and is a cross-sectional view at a portion adjacent to the trench in the lateral direction of the trench (a portion not including the trench). FIG. 3 is a cross-sectional view along the extension direction of the trench, and is a cross-sectional view including the trench. FIG. 4 is a cross-sectional view illustrating a structure in which a plurality of trenches are arranged in a short-side direction (lateral direction) of the trench. In FIG. 1, illustrations of a gate insulating film, a silicide layer, an interlayer insulating film, a source electrode, a drain electrode, and the like are omitted. In FIG. 1, a portion hidden by the gate electrode is illustrated in a transparent manner, and a hidden ridge line among ridge lines of the gate electrode is not illustrated. FIGS. 1, 2, and 3 illustrate a unit cell of the MOSFET. However, the length of the unit cell in the Y-direction may be longer or shorter than that in FIG. 1. In FIG. 2, the contour of a trench that is not visible because the trench is located at the back of the illustrated cross section is indicated by a one-dot chain line.

XYZ coordinate axes used in the description are defined by directions illustrated in the drawings. In the present application, the Z-direction (Z-axis direction) is a direction perpendicular to an upper surface of a Sic substrate, and the X-direction (X-axis direction) and the Y-direction (Y-axis direction) are directions along an upper surface of the SiC substrate and an upper surface of a SiC epitaxial substrate, respectively. Each of the X-direction and the Y-direction is a direction along the upper surface (main surface) of the SiC epitaxial substrate, and the Z-direction is a thickness direction (height direction, depth direction) of the SiC epitaxial substrate. The X-direction, the Y-direction, and the Z-direction are perpendicular to each other. That is, the X-direction and the Y-direction intersect each other in a plan view.

The semiconductor device described here is, for example, a semiconductor chip having a rectangular planar shape. Hereinafter, the structure of the element region in the central portion of the semiconductor chip will be described. Although not illustrated, a field limiting ring (FLR) or a junction termination extension (JTE) is formed as a termination region in an end region surrounding the periphery of an element region on an upper surface of the semiconductor chip.

As illustrated in FIGS. 1 to 4, the semiconductor device in the present embodiment includes an n-type SiC (silicon carbide) epitaxial substrate. A SiC epitaxial substrate (semiconductor substrate) includes an $n^+$ type SiC substrate and an n-type epitaxial layer (semiconductor layer) that is formed on the $n^+$ type SiC substrate and has an impurity concentration lower than that of the SiC substrate. An $n^+$ type drain region is formed in the SiC substrate, and the n-type epitaxial layer functions as a drift layer 2. The thickness of the epitaxial layer is, for example, about 10 μm. The impurity concentration of the drift layer 2 is, for example, $1 \times 10^{16}$ cm$^{-3}$.

As illustrated in FIGS. 1 to 4, a body region (well region) 3 which is a p-type semiconductor region is formed in the drift layer 2 with a predetermined depth from an upper surface of the drift layer 2 (the upper surface of the epitaxial layer). In the unit cell, three body regions 3 extend in the Y-direction and are arranged in the X-direction. A source region 5 which is an $n^+$ type semiconductor region is formed in the body region 3 with a predetermined depth from the upper surface of the drift layer 2 (an upper surface of the body region 3). In addition, a trench 7 is formed from the upper surface of the drift layer 2 (the upper surface of the body region 3) to a middle depth of the body region 3.

In the unit cell, two source regions 5 extending in the Y-direction are formed to be arranged in the X-direction in a plan view. Only the body region 3 is formed between the two source regions 5. In the unit cell, three body regions 3 are arranged in the X-direction. Each of the two source regions 5 is formed between the body region 3 located at the center of the unit cell in the X-direction and the body region 3 located at the end of the unit cell in the X-direction. In other words, the ends of the two source regions 5 in the X-direction are in contact with different body regions 3. In a plan view, a plurality of trenches 7 (first trench group) arranged in the Y-direction is in contact with one source region 5 of the two source regions 5, and a plurality of other trenches 7 (second trench group) arranged in the Y-direction is in contact with the other source region 5. That is, in the unit cell, two rows of the plurality of trenches 7 (trench groups) arranged in the Y-direction are formed to be arranged in the X-direction.

In the unit cell, each trench 7 is formed between the body region 3 located at the center of the unit cell in the X-direction and the body region 3 located at the end of the unit cell in the X-direction. The source region 5 is also formed between the trenches 7 adjacent to each other in the Y-direction. In the drift layer 2 immediately below the source region 5 between the trenches 7 adjacent to each other in the Y-direction, a p-type channel region 6 is formed between the body regions 3 adjacent to each other in the X-direction. The p-type impurity concentration of the channel region 6 is lower than that of the body region 3. The channel region 6 is a channel formation region in which a channel is formed during the operation of the MOSFET. The lower end of the channel region 6 is located above the lower end of each of the body region 3 and the trench 7.

An n-type JFET region 4 is formed in the drift layer 2 immediately below the channel region 6 between the trenches 7 adjacent to each other in the Y-direction. The n-type impurity concentration of the JFET region 4 is equal to or higher than that of the drift layer 2 and lower than that of the source region 5. The depth of the lower end of the JFET region 4 is lower than the lower end of the trench 7 and is located, for example, at the same height as the lower end of the body region 3. The JFET region 4 extends in the Y-direction to overlap the plurality of trenches 7 in a plan view. In the X-direction, side surfaces on both sides of the JFET region 4 are in contact with the body region 3 which is a p-type semiconductor region. In FIGS. 1 to 4, the lower end of the JFET region 4 is indicated by a broken line. As described above, the JFET region 4 is formed from the side surface of the trench 7 to the region below the trench 7. The JFET region 4 is in contact with the drift layer 2 and is electrically connected to the drift layer 2.

That is, the source region 5, the channel region 6, and the JFET region 4 are formed on the side surface of the trench 7 between the trenches 7 adjacent to each other in the Y-direction, in order from the upper surface of the epitaxial layer toward the lower side. The channel region 6 is in contact with the lower end of the source region 5, and the JFET region 4 is in contact with the lower end of the channel region 6. In addition, the drift layer 2 is formed below the JFET region 4 and the body region 3. In other words, the JFET region 4 is formed on the drift layer 2.

A gate electrode 9 is buried in the trench 7 via a gate insulating film 8. The gate electrode 9 is made of, for example, a polysilicon film (conductor film). The gate electrode 9 formed in each trench 7 and arranged in the Y-direction is formed on the trench 7 and on the upper surface of the epitaxial layer, and is integrated with the gate electrode 9 extending in the Y-direction. That is, the gate electrode 9 includes a plurality of trench gate electrodes formed in each trench 7 and a gate wiring extending in the Y-direction. In the cross section along the Y-direction, the gate electrode 9 has a comb-like structure (see FIG. 4). An insulating film 10 is interposed between the upper surface of the epitaxial layer and the gate electrode 9. In addition, the gate electrode 9 on the upper surface of the epitaxial layer is covered with the insulating film 10.

Here, as one of the main features of the present embodiment, the gate electrode 9 on the upper surface of the epitaxial layer, that is, a gate wiring is formed immediately above each of the two rows of trenches 7 arranged in the X-direction in the unit cell, and extends in the Y-direction. That is, the gate wiring is formed between regions immediately above the trenches 7 arranged in the X-direction in the unit cell. In other words, the gate wiring overlaps each of the trenches 7 arranged in the X-direction in the unit cell in a plan view. As described above, since the gate electrode 9 is formed across the trenches 7 arranged in the X-direction in the unit cell, it is possible to secure a wide width of the gate wiring. In addition, two rows of JFET regions 4 extending in the Y-direction are formed immediately below the gate electrode 9 (gate wiring) to be arranged in the X-direction in the unit cell.

That is, in the unit cell, two trench groups including a plurality of trenches 7 arranged in the Y-direction are arranged in the X-direction, and one JFET region 4 extending in the Y-direction is formed immediately below each trench group. A fin made of an epitaxial layer is formed between the trenches 7 adjacent to each other in the Y-direction, and a plurality of the fins are arranged in the Y-direction to form one fin group. That is, in the unit cell, two fin groups each including a plurality of fins arranged in the Y-direction are arranged in the X-direction, and one JFET region 4 extending in the Y-direction is formed immediately below each fin group (each trench group).

The source region 5 is not formed immediately below the gate electrode 9 (gate wiring) formed between the two rows of trenches 7 (two trench groups) arranged in the X-direction in the unit cell, and the body region 3 is formed on the upper surface of the epitaxial layer. That is, a region in which the source region 5 is not formed extends in the Y-direction between the two rows of trenches 7 arranged in the X-direction in the unit cell. In other words, the two source regions 5 formed in the unit cell are spaced apart from each other between the two rows of trenches 7 arranged in the X-direction.

A silicide layer 14 is formed in contact with the upper surface of the source region 5 exposed from the insulating film 10 and the gate electrode 9. The silicide layer 14 is made of, for example, NiSi (nickel silicide). The source region 5 and the body region 3 adjacent to the source region 5, which are formed on the upper surface of the epitaxial layer exposed from the insulating film 10 and the gate electrode 9, are electrically connected to a source electrode (not illustrated) via the silicide layer 14. The channel region 6 is electrically connected to the source electrode via the source region 5 and the silicide layer 14. The silicide layer 14 extends in the Y-direction. A portion where the source region 5 is connected to the source electrode via the silicide layer 14 is a source contact region. That is, the source contact region extends in the Y-direction and is formed to be arranged at both ends in the X-direction in the unit cell. That is, the source contact region is formed in a stripe shape in a plan view.

Note that the gate electrode 9 is electrically connected to the gate electrode (gate pad) via a gate plug penetrating the insulating film 10 on the gate electrode 9 at a portion (not illustrated).

The lower surface (rear surface, bottom surface) of the SiC substrate is covered with the drain electrode 15 in contact with the lower surface of the SiC substrate. That is, the drain electrode 15 is electrically connected to the drain region 1.

The MOSFET (MOS field effect transistor) in the present embodiment is an n-channel MOSFET including the source region 5, the trench 7, the body region 3, the channel region 6, the drain region 1, and the gate electrode 9. The MOSFET further includes the JFET region 4 which is an n-type semiconductor region electrically connected to the drain electrode 15, and the drift layer 2. For example, aluminum (Al) is doped into the p-type body region 3 and the p-type channel region 6 as p-type impurities. For example, N (nitrogen) is doped as n-type impurities into each of the $n^+$ type source region 5, the n-type JFET region 4, the n-type drift layer 2, and the $n^+$ type drain region 1.

As illustrated in FIG. 3, one unit cell in the present embodiment includes two trenches 7 arranged in the X-direction, one gate electrode 9 crossing between the trenches 7, and two JFET regions 4. Therefore, the number of JFET regions 4 formed per unit cell in the present embodiment is two.

During the operation of the MOSFET, electrons flowing through the MOSFET mainly flow from the $n^+$ type source region 5 to the p-type channel region 6 on the side surface of the trench 7, which is a channel formation region adjacent to the gate electrode 9. Thereafter, electrons sequentially move to the n-type JFET region 4, the n-type drift layer 2, the n⁺ type drain region 1, and the drain electrode 15.

By forming the MOSFET having the side surface of the trench 7 as the channel formation region and forming a large number of the trenches 7, it is possible to secure a large gate width while suppressing the area of the semiconductor element in a plan view, and to realize a high-performance semiconductor device.

Effects of Present Embodiment

Next, effects of the semiconductor device according to the present embodiment will be described.

The semiconductor device in the present embodiment includes the plurality of trenches 7 having a longitudinal direction as the X-direction and a lateral direction as the Y-direction in a plan view, a channel having a fin structure divided by the plurality of trenches 7, and a source contact region that is disposed on an end side in the longitudinal direction of the trench 7 and in contact with the source electrode across the body region 3 and the source region 5, and a channel current flows in the longitudinal direction. Here, in a case where a portion between two source contact regions spaced apart from each other in the X-direction is set as the unit cell, a plurality of first fin groups arranged in the Y-direction and a plurality of second fin groups that is arranged in the Y-direction and is spaced apart from the first fin group in the X-direction are provided in the unit cell. In addition, the gate wiring that is formed between the first fin group and the second fin group and extends in the Y-direction is provided, and the gate electrode 9 is buried in the trench 7. The buried gate electrode 9 is connected to the gate wiring.

In other words, the semiconductor device in the present embodiment includes a semiconductor substrate including a drift layer (n-type) of a first conductivity type, plurality of trenches formed that is on an upper surface of the semiconductor substrate and extends in a first direction (X-direction) along the upper surface of the semiconductor substrate, and a body region of a second conductivity type (p-type) different from the first conductivity type, the body region being formed on a side surface of each of the trenches in the lateral direction (Y-direction). The semiconductor device in the present embodiment further includes a source region of the first conductivity type formed on the upper surface of the semiconductor substrate and formed in the body region, and a JFET region of the first conductivity type, which is formed on the upper surface of the drift layer and having side surfaces on both sides in contact with the body region. In addition, the semiconductor device in the present embodiment further includes a drain region of the first conductivity type formed on the lower surface of the semiconductor substrate and electrically connected to the drift layer, and a gate electrode formed in the trench and on the upper surface of the semiconductor substrate via an insulating film. Here, in the unit cell, a plurality of portions of the plurality of trenches are arranged in a second direction intersecting the first direction in a plan view to form a first trench group, a plurality of other portions of the plurality of trenches are arranged in the second direction to form a second trench group, and the trenches forming the first trench group and the trenches constituting the second trench group are arranged in the first direction. In addition, the source region is formed between the trenches adjacent to each other in the second direction, and has a channel region formed at a depth shallower than the depth of the trench on the lower surface of the source region formed between the trenches adjacent in the second direction. The gate electrode includes a first portion (trench gate electrode) buried in each of the plurality of trenches, and a second portion (gate wiring) that is located on the upper surface of the semiconductor substrate, connects the first portions arranged in the first direction to each other, and connects the first portions arranged in the second direction to each other. In addition, a plurality of JFET regions are provided per unit cell.

As described above, unlike the MOSFET of Comparative Example 1 illustrated in FIG. 12, the MOSFET of the present embodiment has the gate wiring (gate electrode 9) formed across the two trenches 7 adjacent in the longitudinal direction of the trench 7. Therefore, the cross-sectional area of the gate wiring can be increased, and the gate wiring resistance can be reduced. In a region between two trenches 7 adjacent to each other in the longitudinal direction of the trench 7, the source region 5 is not formed immediately below the gate wiring. In other words, in the unit cell, the source region includes the source region of the first trench group and the source region of the second trench group, and the source region of the first trench group and the source region of the second trench group are spaced apart from each other immediately below a portion connecting the first portions of the gate electrodes arranged in the first direction in the second portion of the gate electrode. Therefore, even if the gate wiring width is increased as described above, it is possible to prevent an increase in the gate capacitance. Therefore, it is possible to reduce the gate delay time determined by CR (capacitance×resistance), and thus it is possible to improve the performance of the semiconductor device.

As described above, by forming the gate wiring between the two trenches 7 adjacent to each other in the longitudinal direction of the trench 7, the MOSFET in the present embodiment has a larger unit cell than that of Comparative Example 2. Therefore, in order to prevent a decrease in the JFET density, two JFET regions 4 are formed per unit cell in the present embodiment. In other words, the number of JFET regions 4 arranged in the X-direction per unit cell is equal to or more than the number of trenches arranged in the X-direction per unit cell.

As described above, unlike the MOSFET in Comparative Example 2 illustrated in FIG. 13, by forming the plurality of JFET regions 4 per unit cell, it is possible to prevent a decrease in the JFET density and thereby prevent an increase in the on-resistance of the MOSFET. Therefore, it is possible to improve the performance of the semiconductor device.

Modification Example 1

Figure 5:
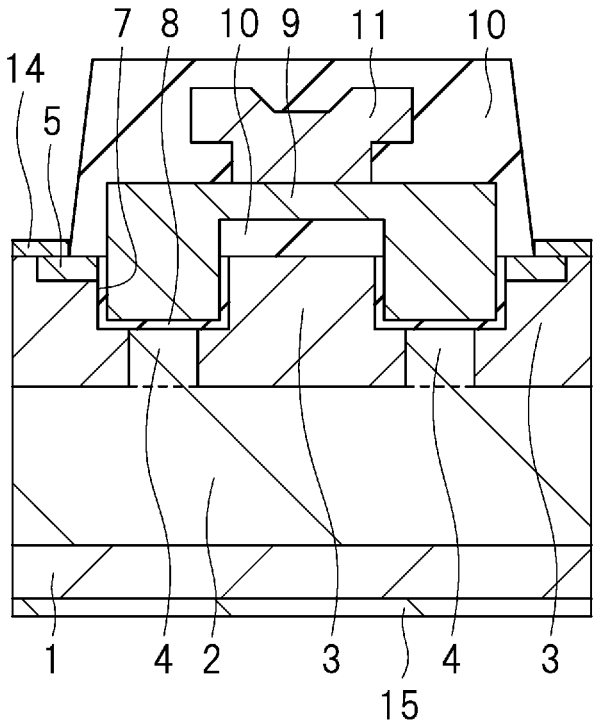
FIG. 5 is a cross-sectional view illustrating a semiconductor device according to a modification example of Embodiment 1.

As illustrated in FIG. 5, a metal wiring 11 connected to the upper surface of the gate wiring may be formed. That is, in the present embodiment, a wide gate wiring is formed not only immediately above one trench group including a plurality of trenches 7 arranged in the Y-direction but also between two trench groups. That is, the gate wiring has a sufficient width. Therefore, the metal wiring 11 extending in the Y-direction can be connected to the upper surface of the gate wiring. The metal wiring 11 is covered with an insulating film 10. The metal wiring 11 is made of, for example, Al (aluminum).

Here, the metal wiring 11 is formed on the gate wiring immediately above the body region 3 having no source contact, between the trenches 7 adjacent to each other in the X-direction. By forming the metal wiring 11, it is possible to reduce the gate wiring resistance and to shorten the gate delay time.

Embodiment 2

A semiconductor device according to the present embodiment will be described below with reference to FIGS. 6 to 8.

Figure 6:
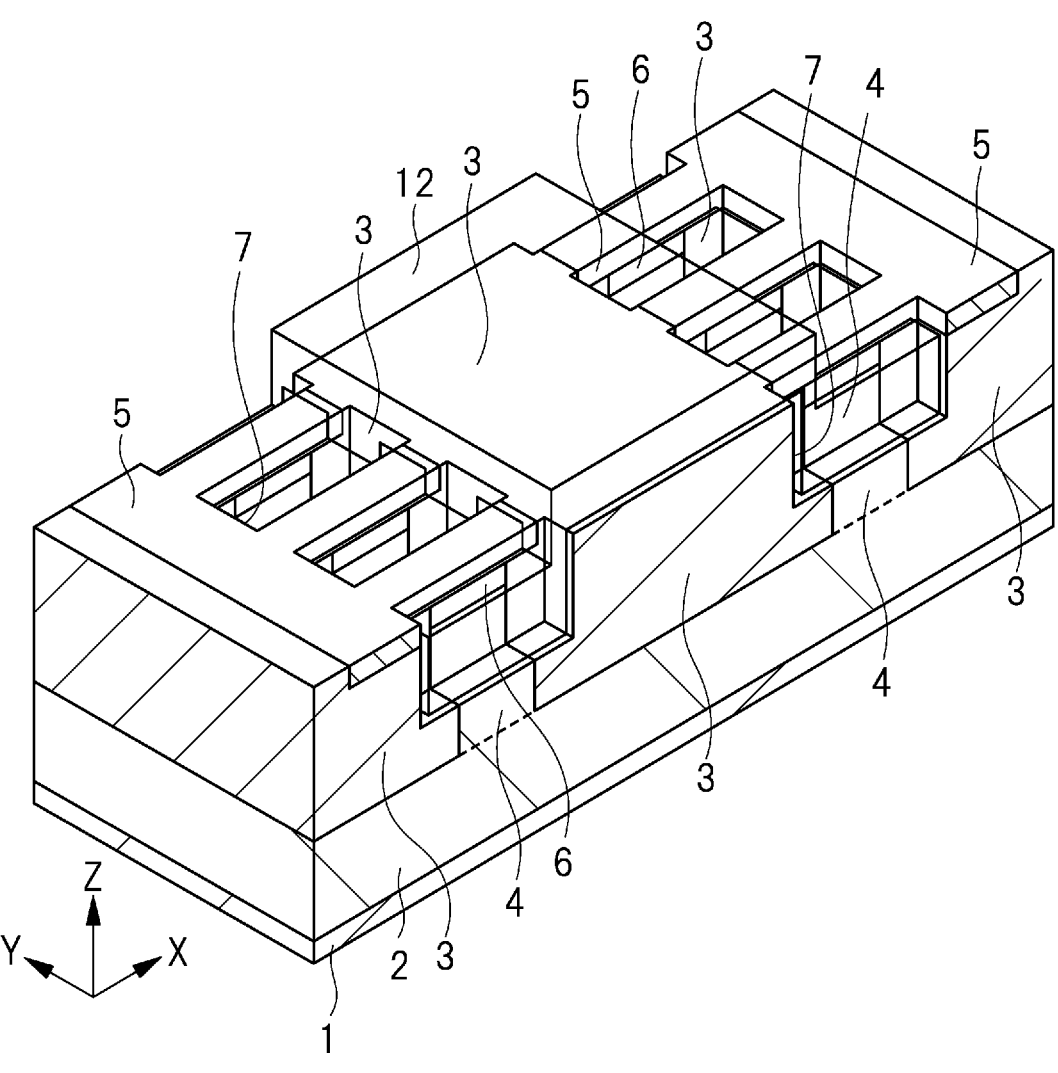
FIG. 6 is a bird-eye view illustrating a semiconductor device according to Embodiment 2.

FIG. 6 is a bird-eye view illustrating the semiconductor device in the present embodiment. FIG. 7 is a cross-sectional view along an extension direction of a trench, and is a cross-sectional view including the trench. FIG. 8 is a cross-sectional view illustrating a structure in which a plurality of trenches are arranged in a short-side direction of the trench. FIGS. 6 and 7 illustrate a unit cell of a MOSFET. In FIG. 6, a portion hidden by the gate electrode is illustrated in a transparent manner, and a hidden ridge line among ridge lines of the gate electrode is not illustrated.

Figure 7:
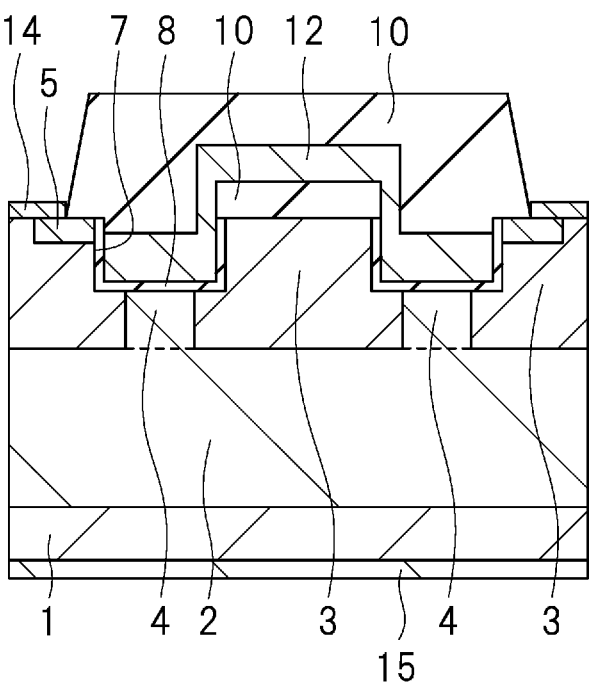
FIG. 7 is a cross-sectional view illustrating the semiconductor device in Embodiment 2.
Figure 8:
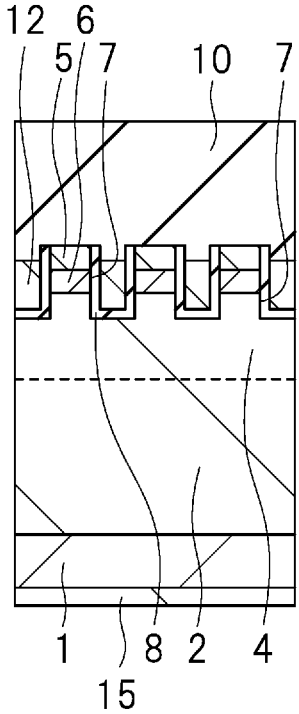
FIG. 8 is a cross-sectional view illustrating the semiconductor device in Embodiment 2.

As illustrated in FIGS. 6 to 8, here, unlike Embodiment 1, the position of an upper surface of a gate electrode 12 (trench gate electrode) in the trench 7 is lower than the position of the upper surface of an epitaxial layer outside the trench 7 (upper end of the trench 7) except for one end in the X-direction. In other words, the height of a portion of the upper surface of the gate electrode 12 in the trench 7 is lower than the upper end of the trench 7. The gate electrode 12 in each of two trenches 7 arranged in the X-direction in the unit cell is connected to the upper gate wiring at the end on the region side between the two trenches 7.

It is conceivable that, when the trench pitch is miniaturized in the Y-direction and the interval between the trenches 7 is narrowed, the tip of the fin between the trenches 7 is pointed, an electric field is concentrated at the tip, and thus a gate breakdown voltage is lowered. Therefore, by making the upper surface of the gate electrode 12 in the trench 7 lower than the upper end of the trench 7 (the upper end of the fin), it is possible to suppress concentration of an electric field at the tip of the fin. Therefore, it is possible to suppress a decrease in the gate breakdown voltage of the MOSFET. On the other hand, since the gate electrode 12 in the trench 7 is connected to the gate wiring on the body region 3 having no source contact, it is possible to supply power to the gate electrode 12 in each trench 7.

In the present embodiment, since the gate wiring width is smaller than that in Embodiment 1, the effect of reducing the gate wiring resistance is reduced, but the effect of reducing the gate wiring resistance as compared with Comparative Example 1, and the effect of reducing the on-resistance as compared with Comparative Example 2 are obtained.

Embodiment 3

Figure 9:
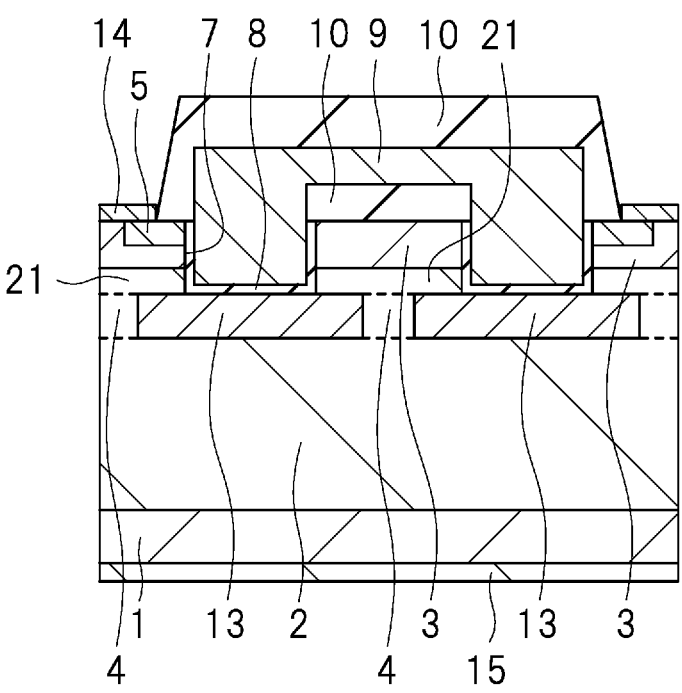
FIG. 9 is a cross-sectional view illustrating a semiconductor device according to Embodiment 3.
Figure 10:
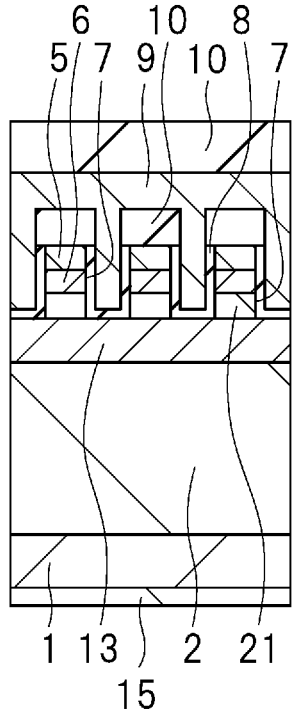
FIG. 10 is a cross-sectional view illustrating the semiconductor device in Embodiment 3.

A semiconductor device according to the present embodiment will be described below with reference to FIGS. 9 and 10. FIG. 9 is a cross-sectional view along an extension direction of a trench, and is a cross-sectional view including the trench. FIG. 10 is a cross-sectional view illustrating a structure in which a plurality of trenches are arranged in a short-side direction of the trench. FIG. 9 illustrates a unit cell of a MOSFET.

In Embodiment 1, the JFET region 4 is formed immediately below the trench 7. On the other hand, the MOSFET in the present embodiment is different from that of Embodiment 1 in that the JFET region 4 is disposed immediately below the source contact region and immediately below the body region 3 having no source contact. That is, one JFET region 4 is formed immediately below a first region between the trenches 7 adjacent to each other in the X-direction, and the other JFET region 4 is formed immediately below a second region adjacent to the trench 7 in the X-direction and opposite to the first region.

In this case, in order to electrically connect the channel region and the JFET region 4, a current diffusion region 21 which is an n-type semiconductor region is formed below the body region 3. Here, the lower surface of the body region 3 is located above the bottom surface of the trench 7. The current diffusion region 21 is formed in the drift layer 2 in a region adjacent to the trench 7 immediately below the body region 3. The n-type impurity concentration of the current diffusion region 21 is higher than the n-type impurity concentration of each of the drift layer 2 and the JFET region 4. In the present embodiment, the number of JFET regions 4 formed per unit cell is two.

Also in order to protect the trench 7 from a high electric field, a p+ type guard region 13 is formed below each of the trench 7 and the current diffusion region 21. The guard region 13 extends in the Y-direction and is in contact with the bottom surface of each of the plurality of trenches 7 arranged in the Y-direction. In FIG. 9, the upper surface of the guard region 13 is located at the same height as the bottom surface of the trench 7, but the upper surface may be located above the bottom surface of the trench 7. The JFET region 4 in the present embodiment is an n-type semiconductor region that is located immediately below the source contact region and between the guard regions 13 arranged in the X-direction. Note that, in the unit cell illustrated in FIG. 9, it seems that the total of three JFET regions 4 including the center, and the left and right in the X-direction are formed, but each of the left and right JFET regions 4 forms one JFET region 4 together with the JFET region 4 at the end of the adjacent unit cell. Therefore, the number of JFET regions 4 formed per unit cell in the present embodiment is two.

In Embodiment 1, the length of the long side of the trench 7 is determined by the width of the JFET region 4, and thus the degree of freedom in design is small, but in the present embodiment, the long side of the trench 7 can be made long regardless of the width of the JFET region 4. Therefore, it is possible to increase the channel density and to reduce the on-resistance. In addition, in the present embodiment, the same effects as those of Embodiment 1 can be obtained.

Embodiment 4

Figure 11:
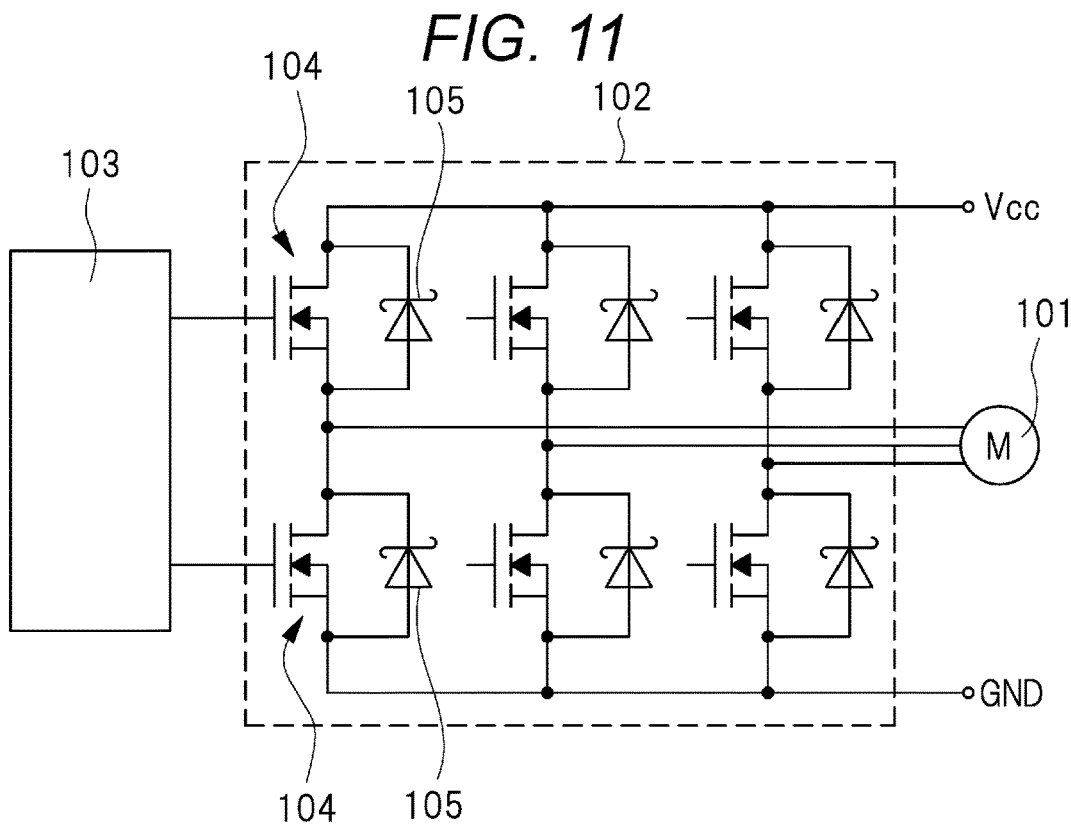
FIG. 11 is a circuit diagram illustrating a power conversion device according to Embodiment 4.

The semiconductor device including the SiC power MOSFET described in Embodiments 1 to 3 can be used for a power conversion device. A power conversion device according to the present embodiment will be described with reference to FIG. 11. FIG. 11 is a circuit diagram illustrating an example of a power conversion device (inverter) according to the present embodiment.

As illustrated in FIG. 11, an inverter 102 includes a SiC MOSFET 104 as a switching element and a diode 105. The SiC MOSFET 104 is the SiC power MOSFET described in any one of Embodiments 1 to 3. In each single phase, the SiC MOSFET 104 and the diode 105 are connected in antiparallel between a power supply voltage (Vcc) and an input potential of a load (for example, a motor) 101 (upper arm). In addition, the SiC MOSFET 104 and the diode 105 are connected in antiparallel between the input potential of the load 101 and the ground potential (GND) (lower arm).

That is, in the load 101, two SiC MOSFETs 104 and two diodes 105 are provided in each single phase, and six SiC MOSFETS (switching elements) 104 and six diodes 105 are provided in three phases. A control circuit 103 is connected to a gate electrode of each of the SiC MOSFETs 104, and the SiC MOSFET 104 is controlled by the control circuit 103. Therefore, the load 101 can be driven by the control circuit 103 controlling a current flowing through the SiC MOSFET 104 forming the inverter 102. The SiC MOSFET 104 and the diode 105 connected in anti-parallel to each other are, for example, separate elements, and are not mounted in the same semiconductor chip in a mixed manner.

The function of the SiC MOSFET 104 forming the inverter 102 will be described below. In order to control and drive the load 101, for example, the motor, it is necessary to input a sine wave of a desired voltage to the load 101. The control circuit 103 controls the SiC MOSFET 104 to perform a pulse width modulation operation of dynamically changing the pulse width of a rectangular wave. The output rectangular wave is smoothed through an inductor to obtain a pseudo desired sine wave. The SiC MOSFET 104 has a function of creating a rectangular wave for performing the pulse width modulation operation.

As described above, according to the present preferred embodiment, the semiconductor device having the low on-resistance and the short gate delay time, which has been described in Embodiments 1 to 3 described above is used for the SiC MOSFET 104. As described above, since the SiC MOSFET 104 has high performance, it is possible to improve the performance of a power conversion device such as an inverter.

In addition, the power conversion device can be used for a three-phase motor system. In a case where the load 101 illustrated in FIG. 11 is a three-phase motor, by using the power conversion device including the semiconductor device described in the present embodiments 1 to 3 as the inverter 102, it is possible to realize the performance enhancement of the three-phase motor system.

In addition, in the present embodiment, it is possible to obtain the same effects as those of the above embodiments.

Hitherto, although the invention made by the present inventors has been specifically described above based on the embodiment, the present invention is not limited to the above embodiment, and various modifications can be made in a range without departing from the gist thereof.

For example, the material, the conductivity type, the manufacturing conditions, and the like of each component are not limited to the description of the above-described embodiments, and each component can be modified in many manners. Here, for easy description, the description has been made on the assumption that the conductivity types of the semiconductor substrate and the semiconductor region have been fixed. The present invention is not limited to the conductivity type described in the above-described embodiments. That is, the MOSFET may be a p-channel type.

INDUSTRIAL APPLICABILITY

The present invention can be widely used in a semiconductor device and a power conversion device having a field effect transistor in which a channel is formed on a side surface of a semiconductor layer.

REFERENCE SIGNS LIST 1 drain region
2 drift layer
3 body region
4 JFET region 5 source region
6 channel region
7 trench
8 gate insulating film
9, 12, 16, 17 gate electrode
13 guard region

The invention claimed is:

1. A semiconductor device comprising:
   a semiconductor substrate having a drift layer of a first conductivity type;
   a plurality of trenches formed on an upper surface of the semiconductor substrate and extending in a first direction along the upper surface of the semiconductor substrate;
   a body region of a second conductivity type different from the first conductivity type, the body region being formed on a side surface of the trench in a lateral direction;
   a source region of the first conductivity type, the source region being formed on the upper surface of the semiconductor substrate and formed in the body region;
   a JFET region of the first conductivity type, the JFET region being formed on an upper surface of the drift layer and having side surfaces on both sides in contact with the body region;
   a drain region of the first conductivity type, the drain region being formed on a lower surface of the semiconductor substrate and electrically connected to the drift layer; and
   a gate electrode formed in the trench and on the upper surface of the semiconductor substrate via an insulating film,
   wherein, in a unit cell, some of the plurality of trenches are arranged in a second direction intersecting with the first direction in a plan view to form a first trench group, and another some of the plurality of trenches are arranged in the second direction to form a second trench group,
   the trenches forming the first trench group and the trenches forming the second trench group are arranged side by side in the first direction,
   the source region is also formed between the trenches adjacent to each other in the second direction,
   a channel region formed at a depth shallower than a depth of the trench is provided on a lower surface of the source region formed between the trenches adjacent to each other in the second direction,
   the gate electrode includes
      a first portion buried in each of the plurality of trenches, and
      a second portion located on the upper surface of the semiconductor substrate, connecting first portions arranged in the first direction to each other, and connecting the first portions arranged in the second direction to each other, and
   plurality of JFET regions is provided per unit cell.

2. The semiconductor device according to claim 1, wherein
   one of the plurality of JFET regions extends in the second direction immediately below the first trench group, and another one of the plurality of JFET regions extends in the second direction immediately below the second trench group.

3. The semiconductor device according to claim 1, wherein one of the plurality of JFET regions is formed immediately below first region between the trenches adjacent to each other in the first direction, and another one of the plurality of JFET regions is formed immediately below a second region adjacent to the trench in the first direction, the second region being opposite to the first region.

4. The semiconductor device according to claim 1, wherein an upper surface of a portion of the first portion of the gate electrode in the trench is lower than an upper end of the trench, and another portion of the first portion of the gate electrode in the trench is connected to the second portion of the gate electrode on the semiconductor substrate.

5. The semiconductor device according to claim 1, further comprising a metal wiring connected to an upper surface of the gate electrode on the semiconductor substrate, the metal wiring extending in the second direction.

6. The semiconductor device according to claim 1, wherein the unit cell is one of a plurality of structures repeatedly arranged in the first direction without inversion.

7. The semiconductor device according to claim 1, wherein in the unit cell, the source region includes a source region of the first trench group and a source region of the second trench group, and the source region of the first trench group and the source region of the second trench group are spaced apart from each other immediately below a portion of the second portion of the gate electrode, the portion connecting the first portions of the gate electrodes arranged in the first direction.

8. The semiconductor device according to claim 1, wherein the semiconductor substrate is a semiconductor substrate containing silicon carbide.

9. A power conversion device using the semiconductor device according to claim 1.

* * * * *